US009445502B2

(12) United States Patent
Zhang et al.

(10) Patent No.: US 9,445,502 B2
(45) Date of Patent: Sep. 13, 2016

(54) FLEXIBLE CIRCUIT CONNECTING DEVICE

(71) Applicants: NANCHANG O-FILM TECH CO., LTD., Nanchang (CN); SUZHOU O-FILM TECH CO., LTD., SUZHOU (CN); SHENZHEN O-FILM TECH CO., LTD., Shenzhen (CN)

(72) Inventors: Sheng Zhang, Shenzhen (CN); Ying Gu, Shenzhen (CN); Shengbo Guo, Shenzhen (CN); Peiting Ma, Shenzhen (CN); Yunliang Yang, Shenzhen (CN)

(73) Assignees: NANCHANG O-FILM TECH CO., LTD., Nanchang (CN); SUZHOU O-FILM TECH CO., LTD., Suzhou (CN); SHENZHEN O-FILM TECH CO., LTD., Shenzhen (CN)

( * ) Notice: Subject to any disclaimer, the term of this patent is extended or adjusted under 35 U.S.C. 154(b) by 225 days.

(21) Appl. No.: 13/968,347

(22) Filed: Aug. 15, 2013

(65) Prior Publication Data

US 2014/0353011 A1 Dec. 4, 2014

Related U.S. Application Data

(63) Continuation of application No. PCT/CN2013/079166, filed on Jul. 10, 2013.

(30) Foreign Application Priority Data

May 30, 2013 (CN) .......................... 2013 1 0209697

(51) Int. Cl.
*H01R 12/77* (2011.01)
*H05K 1/11* (2006.01)
*H05K 3/10* (2006.01)

(52) U.S. Cl.
CPC ............... *H05K 1/118* (2013.01); *H05K 3/107* (2013.01); *H05K 2201/0108* (2013.01); *H05K 2201/0145* (2013.01); *H05K 2201/0376* (2013.01)

(58) Field of Classification Search
CPC ................. H05K 1/118; H05K 3/107; H05K 2201/0108; H05K 2201/0145; H05K 2201/0376
USPC .......................................................... 174/254
See application file for complete search history.

(56) References Cited

U.S. PATENT DOCUMENTS 4,587,378 A 5/1986 Moore
8,754,662 B1 6/2014 Weng (Continued)

FOREIGN PATENT DOCUMENTS

CN 102033672 A 4/2011
CN 102479014 A 5/2012

(Continued)

OTHER PUBLICATIONS

Taiwan Examiner Report of correspondence Taiwan patent application No. 102130398, dated Dec. 25, 2014.

(Continued)

*Primary Examiner* — Timothy Thompson
*Assistant Examiner* — Paul McGee, III
(74) *Attorney, Agent, or Firm* — Hodgson Russ LLP

(57) ABSTRACT

A flexible circuit connecting device is disclosed, including a base layer having a first surface and a second surface, and conductive traces having a grid-like structure and formed on the first surface and/or the second surface. The conductive traces of the above flexible circuit connecting device are nearly aligned with the base layer, and thus the probability of damage under a stress is reduced. Designed to be a grid-like structure, the conductive traces become more transparent, while satisfying a function of a connector. Besides, the above flexible circuit connecting device has a high density circuit trace, so that the size of the connector can be reduced and the interior space of the electronic components can be saved. In a manufacture process of the above flexible circuit connecting device, the manufacture process can be simplified, manufacture efficiency and production yield can be improved, and manufacture cost can be efficiently reduced.

9 Claims, 7 Drawing Sheets

114

1141

114

1141

(56) References Cited

U.S. PATENT DOCUMENTS

| | | | | |
|---|---|---|---|---|
| 2007/0036951 | A1 | 2/2007 | Nguyen et al. | |
| 2007/0103446 | A1 | 5/2007 | Chien et al. | |
| 2008/0218492 | A1 | 9/2008 | Endo | |
| 2009/0008142 | A1 * | 1/2009 | Shimizu | B32B 5/18 174/261 |
| 2012/0251800 | A1 | 10/2012 | Nakayama | |
| 2014/0176819 | A1 | 6/2014 | Yilmaz | |
| 2014/0283698 | A1 | 9/2014 | Cok | |

FOREIGN PATENT DOCUMENTS

| | | | |
|---|---|---|---|
| CN | 202857136 | U * | 4/2013 |
| CN | 202857136 | U | 4/2013 |
| CN | 203313521 | U | 11/2013 |
| JP | 2006-135090 | A | 5/2006 |
| TW | 200642553 | | 12/2006 |
| TW | 201228822 | | 7/2012 |
| WO | WO2011156447 | A1 | 12/2011 |

OTHER PUBLICATIONS

Chinese International Search Report of corresponding International PCT Application No. PCT/CN2013/079166, dated Mar. 6, 2014.

Korea Examination Report of corresponding Korean Application No. 10-2013-7025571, dated Jul. 9, 2014.

* cited by examiner

FLEXIBLE CIRCUIT CONNECTING DEVICE

CROSS-REFERENCE TO RELATED APPLICATIONS

This application is a continuation of International Application No. PCT/CN2013/079166, filed on Jul. 10, 2013, which claims the priority benefit of China Patent Application No. 201310209697.9, filed on May 30, 2013. The contents of the above identified applications are incorporated herein by reference in their entirety.

FIELD OF THE TECHNOLOGY

The present invention relates to the field of circuit board connection, and more particularly to a flexible circuit connecting device.

BACKGROUND

Flexible circuit boards, which have small volume and are capable of withstanding millions of dynamic bendings, and are gradually taking the place of wiring harnesses in the prior art, which have large volume and are not easy to bend. In terms of a thin and light device with a compact and complex internal structure, the total weight and volume of a flexible assembly is reduced by 70%, compared to those of a conventional round conductor harness. With continuous developments of technologies, flexible circuit boards will be the unique solution for satisfying compact and mobile requirements of an electronic component.

A conventional flexible circuit board is to etch a copper foil circuit board on a base layer, and conductive traces are visible from its appearance, so the conventional flexible circuit board is not suitable for manufacturing a fully transparent electronic device which is currently prevalent on the market.

In addition, the conventional flexible circuit board is to etch a copper foil circuit board on a base layer, and its manufacture processes mainly include: exposing->developing->circuit etching->removing undesirable copper foil->surface treating and the like. Restricted by copper foil materials and manufacture processes, the conventional copper foil fails to obtain a high-density circuit trace in the process of etching, and thus will occupy more space when is connected inside of a device.

SUMMARY

In view of the above problems, an object of the present invention is to provide a flexible circuit connecting device which has elegant and transparent appearance and low manufacturing cost.

A flexible circuit connecting device includes:

a base layer having a first surface and a second surface opposite to the first surface;

conductive traces having a grid-like structure and configured on the first surface and/or the second surface.

In one embodiment, the base layer has grooves recessed inwardly, and conductive materials are filled in the interior of the grooves to form the conductive traces.

In one embodiment, the grooves have a depth of 1 μm-6 μm, a width of 0.2 μm-5 μm, and a ratio of the depth to the corresponding width of the grooves is greater than 0.8.

In one embodiment, the grooves are formed with a V-shaped, W-shaped, arc-shaped or corrugated micro-groove at the bottom.

In one embodiment, the micro-grooves have a depth of 0.5 μm-1 μm.

In one embodiment, the conductive traces are attached to the surface of the base layer, protruding from the surface of the base layer by a height in a range of 6 μm-15 μm and by a width in a range of 5 μm-50 μm.

In one embodiment, the first surface and the second surface is connected via a conductive through hole.

In one embodiment, the grid-like structure is a polygonal grid.

In one embodiment, the base layer includes a transparent substrate layer, which is made of a transparent materials selected from one of polyethylene terephthalate (PET), polycarbonate (PC) and polymethyl methacrylate (PMMA), and the conductive traces are formed on the substrate layer.

In one embodiment, the base layer further includes a polymer layer formed on the substrate layer, the conductive traces are formed on the polymer layer, and a material of the polymer layer is a UV curable adhesive.

The conductive traces in the flexible circuit connecting device are designed to be a grid-like structure, so that the conductive traces become more transparent, and achieve transparent and elegant effects. Besides, in the same flexible circuit board, compared to a conventional connector, conductive traces with a grid-like structure can achieve a higher density circuit trace, so that the size and volume of the connector can be greatly reduced, and thus it can be widely applied to electronic components with compact and complex internal structures.

Reference numbers regarding relevant components are as follows:

100: flexible circuit connecting device; 110: base layer; 111: first surface; 112: second surface; 113: conductive through hole; 114: groove; 1141: micro-groove; 115: protrusion; 116: substrate layer; 117: polymer layer; 120: conductive trace; 130: connecting port; 131: first connecting port; 132: second connecting port; 133: third connecting port; 134: forth connecting port.

DETAILED DESCRIPTION

Figure 1:
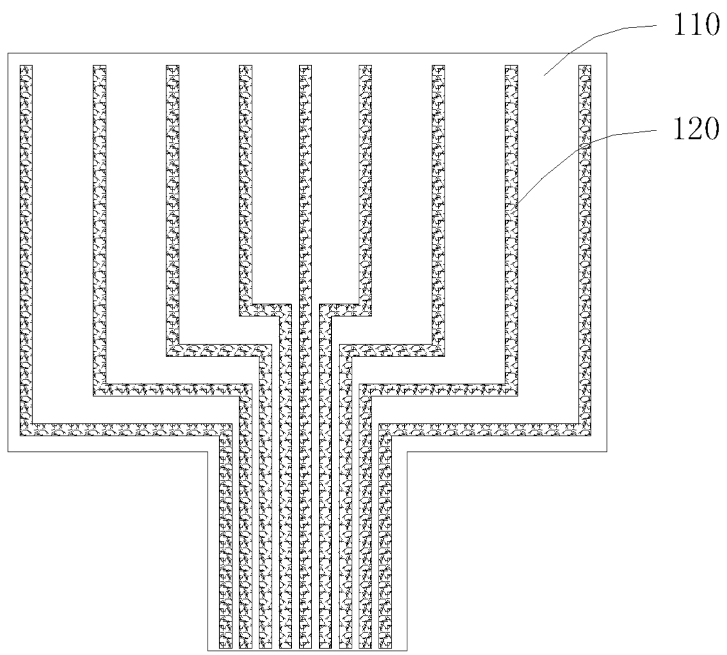
FIG. 1 is a schematic diagram illustrating a basic structure of a flexible circuit connecting device according to the first embodiment.

As shown in FIG. 1, a flexible circuit connecting device 100 according to the first embodiment includes a base layer 110, and conductive traces 120 configured on the base layer 110 according to the practical requirements of the circuit traces. Where, the conductive traces 120 consists of grids made of conductive materials.

Figure 2:
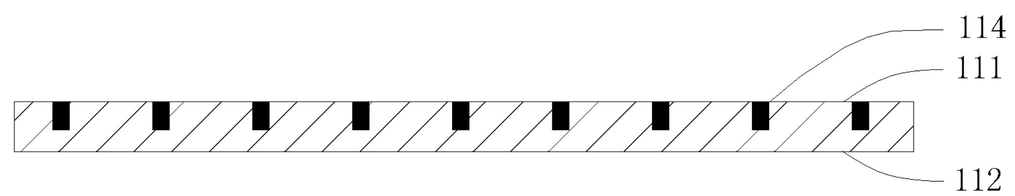
FIG. 2 is a schematic diagram illustrating a cross-section structure of a flexible circuit connecting device with a single-sided groove.
Figure 3:
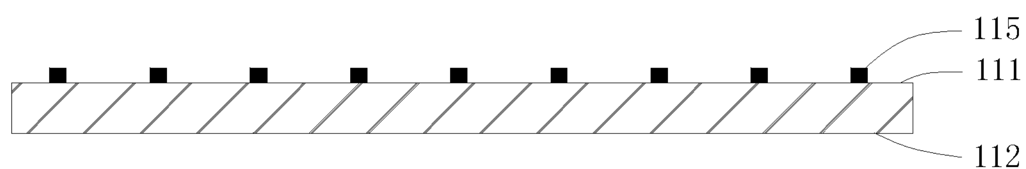
FIG. 3 is a schematic diagram illustrating a cross-section structure of a flexible circuit connecting device with a single-sided protrusion.
Figure 4:
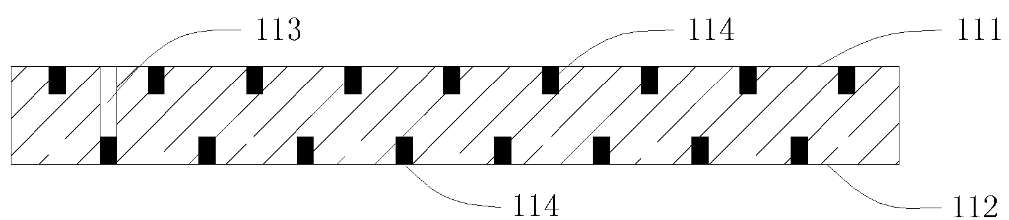
FIG. 4 is a schematic diagram illustrating a cross-section structure of a flexible circuit connecting device with a double-sided groove.
Figure 5:
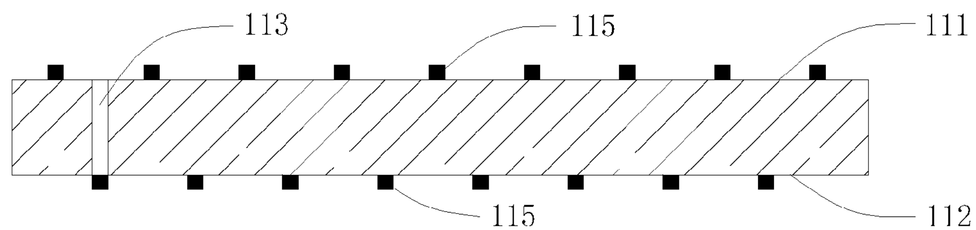
FIG. 5 is a schematic diagram illustrating a cross-section structure of a flexible circuit connecting device with a double-sided protrusion.
Figure 6:
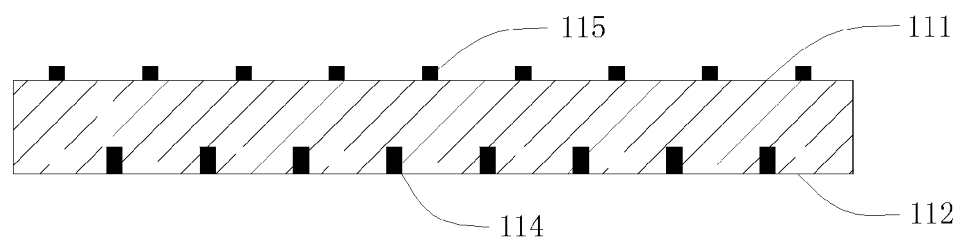
FIG. 6 is a schematic diagram illustrating a cross-section structure of a hybrid flexible circuit connecting device.
Figure 7:
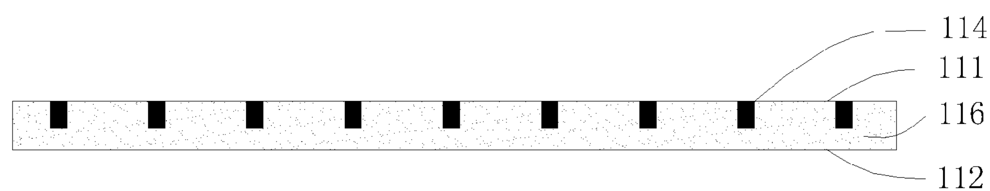
FIG. 7 is a schematic structural diagram illustrating a single-sided conductive trace being formed on a substrate layer.
Figure 8:
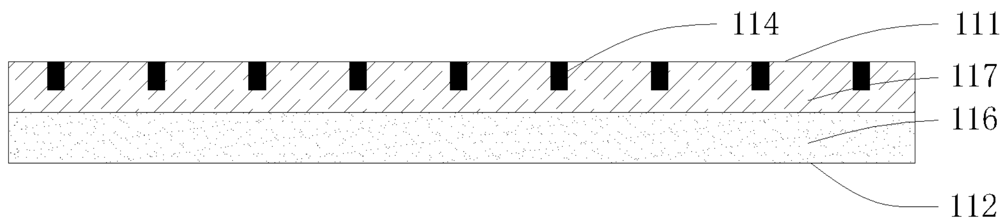
FIG. 8 is a schematic structural diagram illustrating a single-sided conductive trace being formed on a polymer layer.
Figure 9:
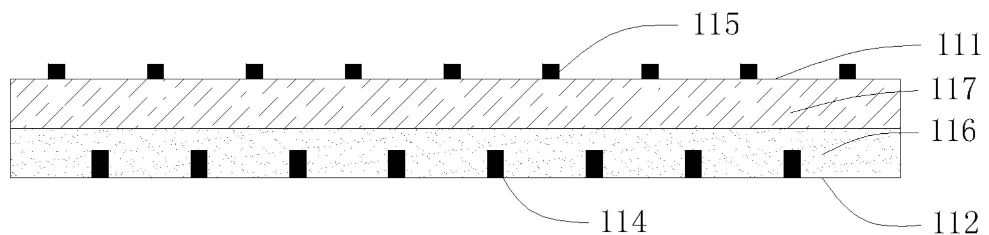
FIG. 9 is a schematic structural diagram illustrating a double-sided conductive trace being formed on a substrate layer and a polymer layer.
Figure 10:
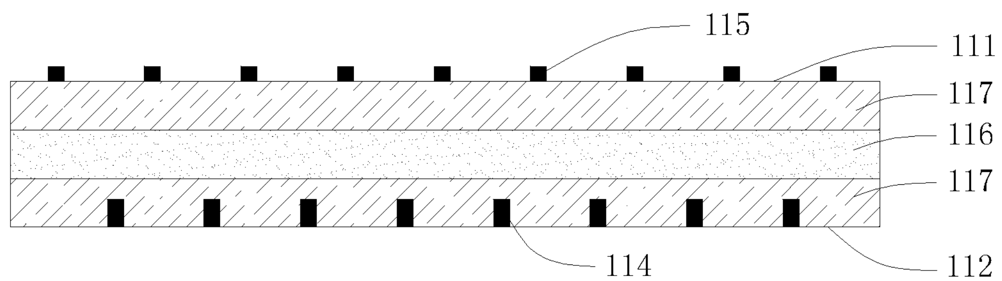
FIG. 10 is a schematic structural diagram illustrating a double-sided conductive trace being formed on a polymer layer.
Figure 11:
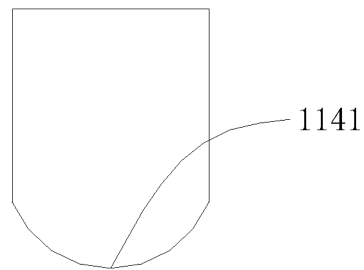
FIG. 11 is a schematic diagram illustrating a first type of structure of a micro-groove at the bottom of a groove.
Figure 12:
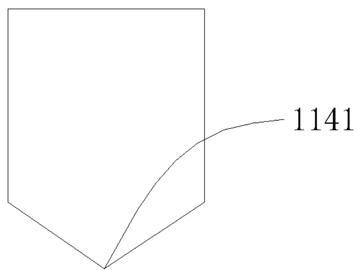
FIG. 12 is a schematic diagram illustrating a second type of structure of a micro-groove at the bottom of a groove.
Figure 13:
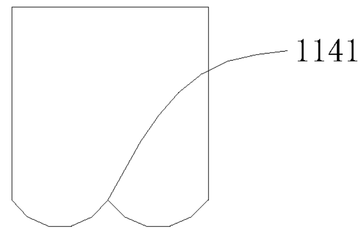
FIG. 13 is a schematic diagram illustrating a third type of structure of a micro-groove at the bottom of a groove.
Figure 14:
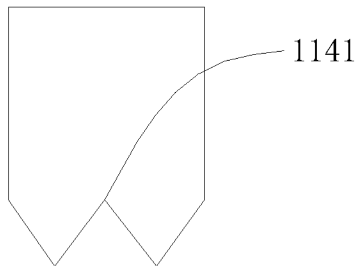
FIG. 14 is a schematic diagram illustrating a fourth type of structure of a micro-groove at the bottom of a groove.
Figure 15:
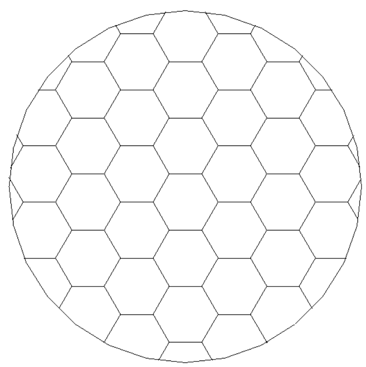
FIG. 15 is a schematic diagram of a first grid-like structure within conductive traces.
Figure 16:
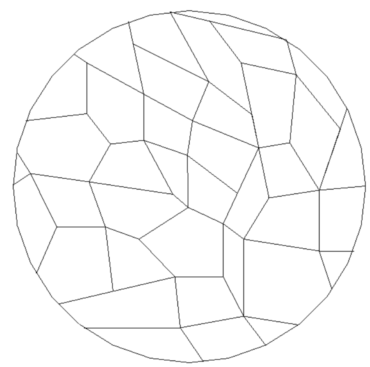
FIG. 16 is a schematic diagram of a second grid-like structure within conductive traces.
Figure 17:
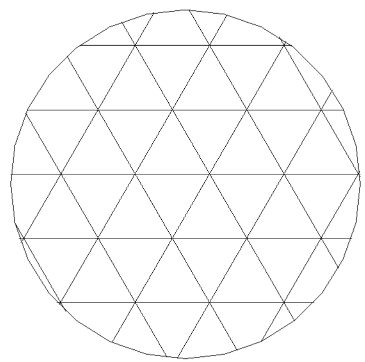
FIG. 17 is a schematic diagram of a third grid-like structure within conductive traces.
Figure 18:
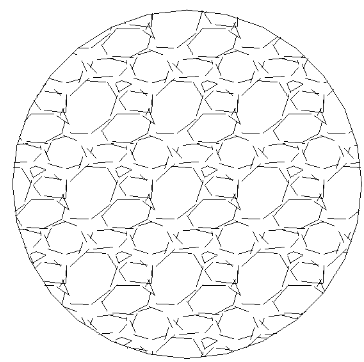
FIG. 18 is a schematic diagram of a fourth grid-like structure within conductive traces.

The base layer 110 has a first surface 111 and a second surface 112. The conductive traces 120 may be configured on either the first surface 111 or the second surface 112 to form a single-sided conductive trace, as shown in FIG. 2 and FIG. 3. The conductive traces 120 may be configured on both the first surface 111 and the second surface 112 to form a double-sided conductive trace 120, and such a structure can achieve a double-sided high-density trace on the base layer 110, improving utilization of the base layer 110, as shown in FIGS. 4, 5 and 6. When a flexible circuit connecting device 100 needs to connect connecting ports only with a single-sided conducting function, the structures shown in FIGS. 4-5 can be adopted, that is, a conductive through hole 113 is drilled between the first surface 111 and the second surface 112, and the conductive traces 120 configured on the second surface 112 can be introduced onto the first surface 111 via the conductive through hole 113. In addition, when a flexible circuit connecting device 100 needs to connect connecting ports with a double-sided conducting function, or both ends of the connecting device 100 need to respectively connect their respective connecting ports, conductive traces on each side of the double-sided conductive trace also can be each independently configured on the base layer 110, as shown in FIG. 6.

In order to keep the appearance of the flexible circuit connecting device 100 transparent, the base layer 110 includes a transparent substrate layer 116, which is made of a transparent material selected from one of polyethylene terephthalate (PET), polycarbonate (PC) and polymethyl methacrylate (PMMA). In addition, in other embodiments, the base layer 110 includes a transparent substrate layer 116, which is made of a transparent material selected from one of polyethylene terephthalate (PET), polycarbonate (PC) and polymethyl methacrylate (PMMA), and a polymer layer 117 formed on the substrate layer 116. The polymer layer 117 can be made of thermoplastic materials, such as a UV curable adhesive. The polymer layer 117 can be formed on either side of the substrate layer 116, or formed on both sides of the substrate layer 116; and the conductive traces 120 can be formed on the substrate layer 116, or on the polymer layer 117, or respectively formed on the substrate layer 116 and the polymer layer 117. FIGS. 7-10 are schematic structural diagrams of four embodiments illustrating formation of the conductive traces 120 configured on the substrate layer 116 and/or the polymer layer 117.

The conductive traces 120 are configured on the base layer 110, which have two types of cross-sectional structures. Shown in FIG. 2 and FIG. 4 illustrate a groove-type cross-sectional structure for a flexible circuit connecting device, in such a structure, the base layer 110 has grooves 114 recessed inwardly, conductive materials are filled in the interior of the grooves 114 to form the conductive traces 120. In practical manufacture process, a male die template printed with traces is made first; and then the male die template is directly imprinted on the base layer 110, grooves 114 with the above trace structure may be directly formed on the base layer 110 via imprinting; finally, a conductive material, such as a metal, for example nano-silver, nano-copper, etc., and a conductive polymer is filled in the grooves 114 to form the groove-type conductive traces 120.

In a preferred embodiment, the grooves 114 has a depth of 1 μm-6 μm, a width of 0.2 μm-5 μm, and in order to ensure stable conduction of the conductive traces 120, a ratio of the depth to the corresponding width of the groove should be greater than 0.8.

Since the groove-type conductive traces 120 with such a structure can achieve a minimum trace width of 0.2 μm, relative to conventional conductive traces etched with copper foils on a polymer layer, and accordingly, the connector 100 can achieve a higher density wiring, compared to a connector manufactured according to a conventional technology, the size and volume of the connector can be greatly reduced, and it is beneficial to apply to electronic components with compact and complex internal structures.

In order to avoid undesired problems, for example conductive materials are broken and form a broken circuit during drying process, the grooves 114 are formed with a V-shaped, W-shaped, arc-shaped or corrugated micro-groove 1141 at the bottom. FIGS. 11-14 are schematic diagrams illustrating four types of the micro-grooves 1141 at the bottom of the grooves 114. In a preferred embodiment, the micro-grooves have a depth of 0.5 μm-1 μm.

Furthermore, conductive materials also can be attached to the base layer 110 by way of ink-jet printing or screen printing to form protrudent conductive traces 120. FIG. 3 and FIG. 5 illustrate flexible circuit connecting devices 100 with protrudent cross-sectional structure, where a circuit protrusion 115 has a height of 6 μm-15 μm and a width of 5 μm-50 μm.

The copper foil used in a conventional technique usually has a thickness of 18 μm, 35 μm, 55 μm or 70 μm. A flexible circuit connecting device with etched copper foil of such a thickness generally has a relatively high protrusion, and can be easily touched and scraped under actions of external forces. In contrast, the protrusion of the conductive trace 120 in this embodiment has a maximum thickness of 15 μm, and it is nearly flush with the base layer 110, and thus is not easy to be scraped under actions of external forces. Thus probabilities of damages to the conductive traces 120 under actions of external forces, such as a broken circuit and/or a short circuit are greatly reduced.

Besides, the conductive traces 120 are designed to have a grid-like structure. FIGS. 15-18 are schematic diagrams of four types of grid-like structures within the conductive traces 120, where the grid-like structure can be a regular polygonal grid or an irregular grid. Only four types of grid-like structures are illustrated herein, and the grid-like structure also can be of a diamond or a rectangle shape, also can be a polygonal shape with a corrugated side-length, etc. A conductive trace with the grid-like structure usually has a trace width of 0.2 μm-50 μm, which is visually non-recognizable, not only satisfying a function of a connector, but also achieving a transparent effect, and thus ensuring an elegant appearance. Accordingly, such a structure can be applied to trace connection of a fully transparent electronic device.

Figure 19:
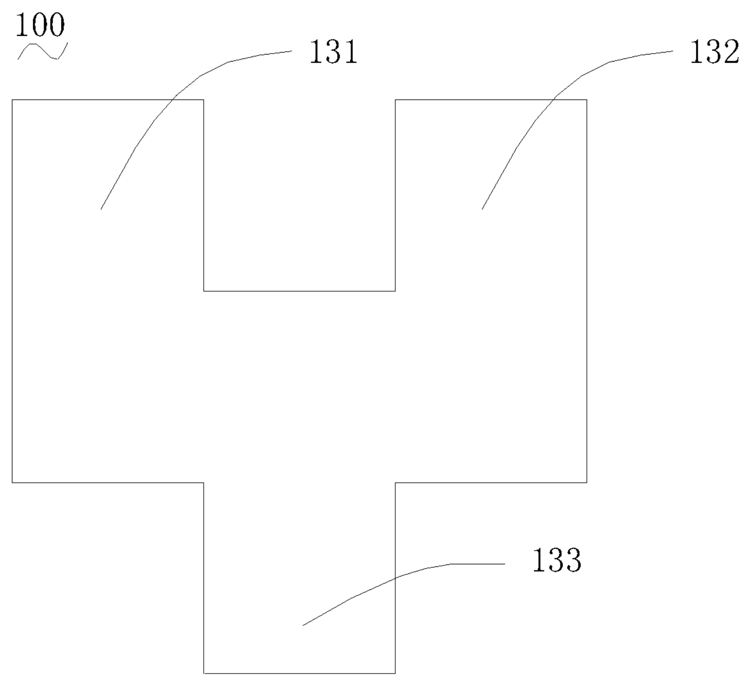
FIG. 19 is a schematic diagram of a flexible circuit connecting device according to the second embodiment.
Figure 20:
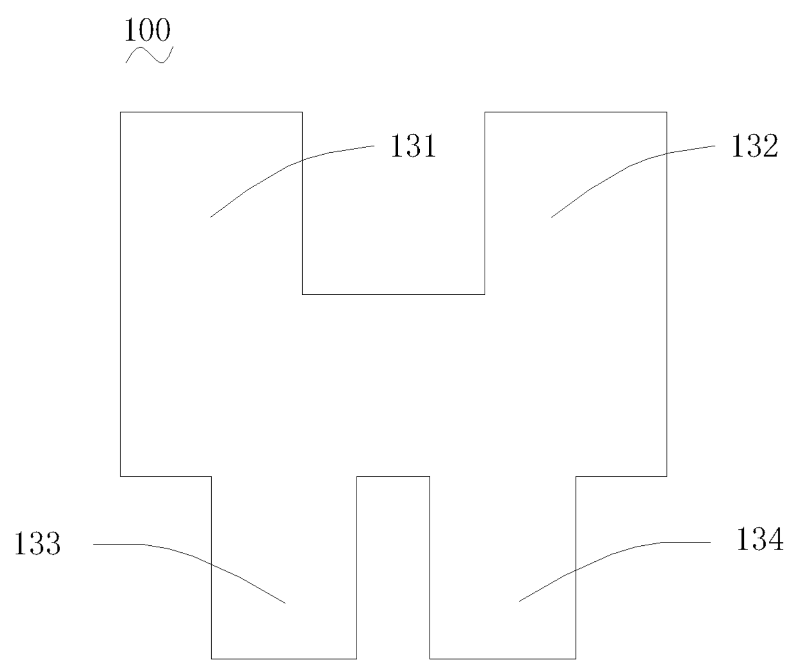
FIG. 20 is a schematic diagram of a flexible circuit connecting device according to the third embodiment.

FIG. 19 and FIG. 20 are schematic diagrams illustrating basic structures of flexible circuit connecting devices according to other embodiments.

FIG. 19 illustrates a flexible circuit connecting device 100 according to the second embodiment, having three connecting ports 130: a first connecting port 131, a second connecting port 132 and a third connecting port 133. Each connecting port 130 is electrically conducted to the conductive traces 120 formed on the flexible circuit connecting device 100, and specifically, the first connecting port 131 and the second connecting port 132 are respectively connected with an output end of an external circuit, the third connecting port 133 is connected with an input end of the external circuit. Besides, both sides of the connecting device 100 can be designed with a conductive traces 120, respectively, and these two conductive traces 120 are conducted to each other via a conductive through hole 113, depending on practical design requirements. At this time, the first connecting port 131 is connected with a first output end of the external circuit, the second connecting port 132 is connected with a second output end of the external circuit, and the third connecting port 133 is connected with a common input end of the external circuit. Alternatively, the first connecting port 131 is connected with a common output end of the external circuit, the second connecting port 132 is connected with a first input end of the external circuit, and the third connecting port 133 is connected with a second input end of the external circuit.

FIG. 20 illustrates a flexible circuit connecting device 100 according to Embodiment 3, having four connecting ports 130: a first connecting port 131, a second connecting port 132, a third connecting port 133 and a forth connecting port 134. Different from Embodiment 2, two conductive traces 120 are respectively laid on both sides of the flexible circuit connecting device 100, where the two conductive traces 120 are designed independently from each other, and conductive traces 120 at the both sides are respectively connected to different connecting ports 130. That is, the first connecting port 131 is connected with a first output end of an external circuit, the third connecting port 133 is connected with a first input end of the external circuit, the second connecting port 132 is connected with a second output end of the external circuit, and the fourth connecting port 134 is connected with a second input end of the external circuit. In this way, in connectors according to this embodiment, only one connecting device can achieve a connection to a plurality of external devices, so that the interior space of the electronic components occupied by connecting devices can be greatly saved.

The conventional flexible circuit board is to etch a copper circuit on a base layer, and its manufacture process mainly includes: cutting->drilling->copper attaching->circuit aligning->exposing ->developing->circuit etching->removing undesirable copper foil->surface treating>sticking a covering film->pressing->curing->surface treating->nickel gold depositing->cutting->electrically measuring, and finally testing->packaging->delivering and the like. Since the manufacture process is relatively complex, any quality problem in different processes of the manufacture process will cause the final production yield to decline, and thus cause manufacture cost to increase. In this embodiment of the present invention, relatively simple and environmental-friendly manufacture processes, for example, "pressing film->filling conductive materials->removing excess conductive materials->curing" (manufacture processes of a groove-type flexible circuit connecting device 100) or "ink-jet printing/screen printing->curing" (manufacture processes of a protrudent flexible circuit connecting device 100) are used to replace the following processes that are complex and may easily cause personal injuries in the conventional manufacture processes: "exposing->developing->circuit etching->removing undesirable copper foil->surface treating". Therefore, the manufacture process can be simplified, manufacture efficiency and production yield can be improved, and manufacture cost of the connecting device can be efficiently reduced.

The above embodiments merely describe several implementing modes of the present invention with specific details, but are not intended to limit the scope of the present invention. It should be recognized that various modifications and improvements may be made to the present invention by persons skilled in the art without departing from the concept of the present invention, modifications and improvements also fall within the scope of the invention. The scope of the invention should be subject to the appended claims.

What is claimed is:

1. A flexible circuit connecting device, comprising:

a base layer having a first surface and a second surface opposite to the first surface;

conductive traces having a grid-like structure and configured on the first surface and/or the second surface; wherein the base layer has grooves recessed inwardly, and conductive materials are filled in the interior of the grooves to form the conductive traces; and a bottom surface of the grooves defines a V-shaped, W-shaped, arc-shaped or corrugated micro-groove, and the V-shaped, W-shaped, arc-shaped or corrugated micro-groove defined by the bottom has a depth of 0.5 μm-1 μm.

2. The flexible circuit connecting device according to claim 1, wherein the grooves have a depth of 1 μm-6 μm, a width of 0.2 μm-5 μm, and a ratio of the depth to the corresponding width of the grooves is greater than 0.8.

3. The flexible circuit connecting device according to claim 1, wherein the conductive traces protrudes from the surface of the base layer by a height in a range of 6 μm-15 μm and by a width in a range of 5 μm-50 μm.

4. The flexible circuit connecting device according to claim 1, wherein the first surface and the second surface is connected via a conductive through hole.

5. The flexible circuit connecting device according to claim 1, wherein the grid-like structure is a polygonal grid.

6. The flexible circuit connecting device according to claim 1, wherein the base layer comprises a transparent substrate layer, which is made of a transparent material selected from one of polyethylene terephthalate (PET), polycarbonate (PC) and polymethyl methacrylate (PMMA), and the conductive traces are formed on the substrate layer.

7. The flexible circuit connecting device according to claim 6, wherein the base layer further comprises a polymer layer formed on the substrate layer, the conductive traces are formed on the polymer layer, and a material of the polymer layer is a UV curable adhesive.

8. The flexible circuit connecting device according to claim 1, wherein each of the grooves defines an opening opposite the bottom surface.

9. The flexible circuit connecting device according to claim 1, wherein each of the grooves defines at least one sidewall, and wherein the sidewall is in contact with the micro-groove.

* * * * *